United States Patent [19]
Sekiya

[11] Patent Number: 4,578,342
[45] Date of Patent: Mar. 25, 1986

[54] PRESENSITIZED DIAZO LITHOGRAPHIC PLATE WITH ANODIZED AND SILICATED ALUMINUM PLATE SURFACE AND SUBBING LAYER OF POLYMER WITH SULFONIC ACID GROUP

[75] Inventor: Toshiyuki Sekiya, Shizuoka, Japan

[73] Assignee: Fuji Photo Film Co., Ltd., Kanagawa, Japan

[21] Appl. No.: 557,303

[22] Filed: Dec. 2, 1983

[30] Foreign Application Priority Data

Dec. 2, 1982 [JP] Japan ................ 57-211942

[51] Int. Cl.$^4$ ................ G03C 1/60; G03C 1/94
[52] U.S. Cl. ................ 430/159; 430/160; 430/175; 430/176; 430/275; 430/276; 430/278; 430/302
[58] Field of Search ............ 430/160, 159, 302, 278, 430/175, 176, 275, 276

[56] References Cited

U.S. PATENT DOCUMENTS

| | | | |
|---|---|---|---|
| 3,136,639 | 6/1964 | Deal et al. | 430/160 |
| 3,549,365 | 12/1970 | Thomas | 430/160 |
| 4,123,276 | 10/1978 | Kita et al. | 430/176 |
| 4,172,729 | 10/1979 | Narutomi et al. | 430/302 |
| 4,225,665 | 9/1980 | Schodt | 430/160 |
| 4,230,492 | 10/1980 | Thomas | 430/159 |
| 4,232,105 | 11/1980 | Shinohara et al. | 430/160 |
| 4,277,555 | 7/1981 | Fromson et al. | 430/302 |
| 4,332,874 | 6/1982 | Hayashi et al. | 430/25 |
| 4,427,765 | 1/1984 | Mohr et al. | 430/160 |
| 4,467,027 | 8/1984 | Yamamoto et al. | 430/175 |

FOREIGN PATENT DOCUMENTS 55-100554  7/1980  Japan ................ 430/302

OTHER PUBLICATIONS

Borden, D. G., *Research Disclosure*, No. 17712, 1/1979.

Primary Examiner—Charles L. Bowers, Jr.
Attorney, Agent, or Firm—Sughrue, Mion, Zinn, Macpeak, and Seas

[57] ABSTRACT

A presensitized lithographic plate is disclosed. The plate is comprised of a support base such as an aluminum support base having an anodized surface having a subbing layer positioned thereon which is coated with a light-sensitive layer. The light-sensitive layer is comprised of a diazo compound and a binder or comprised of a photopolymerizable composition. The subbing layer is comprised of a high molecular compound containing a sulfonic acid group-containing monomer units as recurring units. The subbing layer provides a lithographic plate which has greatly improved shelf life. The subbing layer increases the stability of the lithographic plate such that when the plate is stored it continues to be capable of producing copies which do not have stained background areas even when the plate is stored under adverse temperature and humidity conditions.

23 Claims, No Drawings

PRESENSITIZED DIAZO LITHOGRAPHIC PLATE WITH ANODIZED AND SILICATED ALUMINUM PLATE SURFACE AND SUBBING LAYER OF POLYMER WITH SULFONIC ACID GROUP

FIELD OF THE INVENTION

This invention relates to a presensitized lithographic plate. More particularly, it relates to a presensitized lithographic plate having improved developability and resistance with respect to the formation of background stains.

BACKGROUND OF THE INVENTION

One of essential requirements for lithographic printing plates is to provide copies having no background stains. Background stains increase particularly in proportion to the storage period after preparation of the printing plate. Printing plates which have no background stains immediately after their preparation undergo formation of background stains over time. This tendency is conspicuous particularly when printing plates are stored at high temperatures and under high humidity. Therefore, presensitized lithographic plates which resist formation of background stains when stored for a long time particularly at high temperatures and under high humidity have been desired.

Many attempts to obtain such lithographic plates have been conducted. For example, there have been known a presensitized lithographic plate comprising an anodized aluminum plate having provided thereon in sequence a subbing layer composed of polyvinylphosphonic acid and a diazo compound-containing light-sensitive layer (West German Pat. No. 1,621,478) (corresponding to U.S. Pat. No. 4,153,461), a presensitized lithographic plate comprising an aluminum support having provided thereon in sequence a subbing layer of polyacrylic acid or the like and a diazo resin layer (West German Pat. No. 1,091,433), a presensitized lithographic plate comprising a polyacrylamide-subbed support having provided thereon a light-sensitive layer (U.S. Pat. No. 3,511,661), a technique of adding a high molecular organic acid to a light-sensitive layer of a presensitized lithographic plate containing a diazo compound and an organic high molecular carrier in the light-sensitive layer for the purpose of improving stability with time of the plate and preventing formation of background stains (Japanese Patent Application (OPI) No. 107238/81 (the term "OPI" as used herein refers to a "published unexamined Japanese patent application")), and the like. However, none of these techniques have exerted satisfactory effects, and, hence, more improvements have been desired.

Japanese Patent Application (OPI) No. 5042/82 (corresponding to U.S. Pat. No. 4,401,743) describes a light-sensitive adduct containing a combination of a diazo resin having a plurality of side chain diazonium groups and a sulfonated polymer having a plurality of sulfonato groups (e.g., sulfonated polyurethane or sulfonated polyester). This adduct, however, fails to attain the effect of preventing formation of background stains and, in addition, performance of a presensitized plate using it is governed by the properties of the sulfonated polyurethane or sulfonated polyester because the adduct is used as a light-sensitive layer itself and, as a result, the applicable scope of the lithographic plate is extremely limited.

Further, Research Disclosure, No. 17712 (January 1979) discloses a light-sensitive lithographic printing plate comprising a grained and anodized aluminum sheet having thereon a subbing layer of a high molecular compound containing sulfonic acid group-containing monomer units as recurring units. This subbing layer is intended to maintain hydrophilicity of non-image area throughout development and press runs and is not provided for improving shelf-life of lithographic printing plates. In fact, in specific examples, a light-sensitive layer comprising poly-1,4-cyclohexylenebis-(oxyethylene)-p-phenylenediacrylate-co-3,3'-[(sodioiminodisulfonyl)dibenzoate], a dye, a sensitizer and azide for print-out is used, and a plate sample having the light-sensitive layer and having been incubated at 120° F. and 50% RH for 2 weeks cannot be developed with a developer to be used for developing fresh plates and is, therefore, developed with dichloroethane having stronger solvent action.

SUMMARY OF THE INVENTION

It is, therefore, an object of the present invention to provide a presensitized lithographic plate comprising a support having provided thereon a subbing layer and a light-sensitive layer with comparatively poor shelf-life stability and liability to form stains in nonimage areas such as a light-sensitive layer comprising a diazo compound and a binder, which plate has a subbing layer capable of preventing formation of background stains when printing is conducted using a lithographic printing plate prepared from the presensitized lithographic plate by an imagewise exposure and a development even after having been stored for a long period of time after production of the presensitized lithographic plate or having been stored at high temperature and high humidity.

As a result of intensive investigations, the inventors have found that presensitized lithographic plates, which resist the formation of stains, can be obtained by providing a subbing layer comprising a high molecular compound containing at least one kind of sulfonic acid group-containing monomer units as recurring units.

DETAILED DESCRIPTION OF THE INVENTION

Specific examples of monomer units which have a sulfonic acid group, and are used in the present invention include those derived from such monomers as p-styrenesulfonic acid, 2-acrylamido-2-methylpropanesulfonic acid, ethylenesulfonic acid, 2-chloroethylenesulfonic acid, ethylenedisulfonic acid, 1-propene-1-sulfonic acid, 1-propene-2-sulfonic acid, 2-methyl-1,3-propenedisulfonic acid, 1-butene-1-sulfonic acid, 1-pentene-1-sulfonic acid, 1-hexene-1sulfonic acid, 2-phenylethylenesulfonic acid, 1-methyl-2-phenylethylene-sulfonic acid, 3-chloroallylsulfonic acid, allylsulfonic acid, 3-chloro-2-butenesulfonic acid, 3-chloromethallylsulfonic acid, methallylsulfonic acid, 3-methyl-2-butene-2-sulfonic acid, 3-phenylallylsulfonic acid, 3phenylmethallylsulfonic acid, 2-benzylallylsulfonic acid, 2-chloro-4-styrenesulfonic acid, vinyltoluenesulfonic acid, α-methylstyrenesulfonic acid, etc. Of these, p-styrenesulfonic acid, 2-acrylamido-2-methylpropanesulfonic acid, and ethylenesulfonic acid are particularly preferable monomers. One or more of these monomers are selected and polymerized or copolymerized with other monomers. In conducting copolymerization, any monomer that can be copolymerized with the sulfonic acid group-containing monomer can be used. Particularly preferable examples of such monomers include, for example, alkyl acrylates (e.g., methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, 2-hydroxyethyl acrylate, etc.), alkyl methacrylates (e.g., methyl methacrylate, ethyl methacrylate, n-propyl methacrylate, isopropyl methacrylate, n-butyl methacrylate, isobutyl methacrylate, n-amyl methacrylate, 2-ethylhexyl methacrylate, n-octyl methacrylate, n-decyl methacrylate, 2-hydroxyethyl methacrylate, etc.), styrenes (e.g., styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p-chlorostyrene, 2,4-dichlorostyrene, 2,5-dichlorostyrene, 2,6-dichlorostyrene, 3,4-dichlorostyrene, p-bromostyrene, p-cyanostyrene, etc.) acrylonitrile, methacrylonitrile, acrylamide, N-sec-butylacrylamide, N-tert-butylacrylamide, N,N-dibutylacrylamide, N-tert-butylmethacrylamide, acrylic acid, methacrylic acid, vinyl acetate, etc.

The molecular weight of the high molecular compound to be used in the present invention is not limited as long as it is solvent-soluble but, as a general guide, a range of from about 1,000 to about 1,000,000 is suitable, with a range of 2,000 to 100,000 being preferable and a range of 10,000 to 100,000 being most preferable.

The content of sulfonic acid group-containing monomer units in the high molecular compound can be selected over a wide range, with a range of about 1 to 100 mol % being suitable and a range of 5 to 100 mol % being more preferable.

The high molecular compound of the present invention can be synthesized according to a known process, for example, by conducting polymerization according to a solution polymerization process and, if desired, neutralizing the acid groups of the resulting polymer to form salts thereof, such as alkali metal salts, e.g., sodium salt, potassium salt, etc., ammonium salts and water-soluble amine salts. This solution polymerization process is usually conducted in a solvent capable of dissolving the starting monomer or monomers, such as isopropyl alcohol, in a nitrogen atmosphere in the presence of a polymerization initiator. Alternatively, the starting monomer or monomers may be emulsified in water with the aid of a surfactant and subjected to emulsion polymerization using a polymerization initiator such as potassium persulfate to obtain an aqueous dispersion. The polymer solids may of course be collected as solids.

When coating the above-described high molecular compound, it is dissolved in a suitable solvent and coated on a support in a conventionally known manner. The coating amount of the compound depends upon the kind of the high molecular compound to be used, and hence it cannot be set forth unequivocally. However, as a general guide, a coating amount of 0.0001 to 1 g/m² is suitable. If the amount is less than 0.0001 g/m², the effect of depressing formation of background stain becomes insufficient and, if it is more than 1 g/m², there result detrimental influences on durability of the resulting lithographic printing plates, etc. Thus, an amount of 0.0005 to 0.2 g/m² is preferable. The solution for the subbing layer may contain suitable additives such as pH-adjusting agents (e.g., phosphorous acid, oxalic acid, low molecular organic sulfonic acid, etc.) and wetting agents (e.g., saponin).

The subbing layer of the present invention can be coated on various supports. Preferable supports include an aluminum plate anodized in a sulfuric acid bath and then treated with a phosphoric acid bath as described in British Pat. No. 1,441,476, an aluminum plate anodized in a phosphoric acid bath as described in U.S. Pat. No. 3,511,661, an aluminum plate anodized in a sulfuric acid bath described in Japanese Patent Publication No. 20922/76 (corresponding to British Pat. No. 1,412,768), and an aluminum plate electrolytically grained and then anodized as described in British Pat. No. 1,208,224. However, it has been found that the most preferable results are obtained by providing the subbing layer of the present invention on an aluminum plate having been anodized and then treated with a sodium silicate aqueous solution as is disclosed in U.S. Pat. No. 3,181,461.

In accordance with the invention, a light-sensitive layer is provided on a support having the above-described subbing layer to obtain a presensitized lithographic plate which undergoes formation of remarkably reduced stain in non-image areas even after being stored for a long time. Examples of useful light-sensitive layers include that containing both a diazo compound and an organic high molecular binder, and a photopolymerizable light-sensitive layer which comprises an addition-polymerizable unsaturated compound, a photopolymerization initiator, and an organic high molecular binder. Of these, the light-sensitive layer containing both a diazo compound and an organic high molecular binder serves to obtain the greatest effect of the present invention. Therefore, this light-sensitive layer will be described in detail below.

Particularly preferable diazo compounds are diazo resins which are soluble in an organic solvent and substantially insoluble in water, and diazo resins represented by a condensate between an aromatic diazonium salt and, for example, an active carbonyl-containing compound (particularly, formaldehyde) are useful. Useful diazo resins include Lewis acid salts (such as hexafluorophosphate or tetrafluoroborate) of a condensate between p-diazodiphenylamine and formaldehyde or acetaldehyde (described in, for example, Japanese Patent Publication No. 17602/64 and Japanese Patent Application (OPI) No. 98613/79), anionic surfactant salts of a condensate between p-diazodiphenylamine and formaldehyde (described in Japanese Patent Application (OPI) Nos. 6813/66 and 9804/73), phenol salts, fluorocaprates or sulfonates (e.g., triisopropylnaphthalenesulfonate, 4,4'-biphenyldisulfonate, 5-nitro-o-toluenesulfonate, 5-sulfosalicylate, 2,5-dimethylbenzenesulfonate, 2-nitrobenzenesulfonate, 3-chlorobenzenesulfonate, 2-chloro-5-nitrobenzenesulfonate, 2-fluorocaprylnaphthalenesulfonate, 1-naphthol-5-sulfonate, 2-methoxy-4-hydroxy-5-benzoylbenzenesulfonate, p-toluenesulfonate, etc.) of a condensate between p-diazodiphenylamine and formaldehyde (described in U.S. Pat. No. 3,300,309, Japanese Patent Application (OPI) No. 38302/72, and U.S. Pat. No. 4,123,276), organophosphonates of a condensate between p-diazodiphenylamine and formaldehyde (described in U.S. Pat. No. 3,404,003), aromatic carboxylates of a condensate between p-diazodiphenylamine and formaldehyde (described in Japanese Patent Publication No. 28594/70), and phosphates or oxalates of a condensate between p-diazodiphenylamine and formaldehyde. Other useful diazo resins include a condensate between substituted or unsubstituted diphenylamine-4-diazonium salt and an ether compound (described in U.S. Pat. No. 3,679,419). Of these, halogenated Lewis acid salts of a condensate between an aromatic diazonium compound and an active carbonyl compound or active ether compound, especially tetrafluoroborate and hexafluorophosphate, are most preferable as a diazo resin to be used in the present invention. Additionally, the term "substantially water-insoluble" used with the diazo resin of the present invention means a solubility of about 1 wt % or less in water at an ordinary temperature.

On the other hand, as the organic high molecular binder to be used in the present invention, those which are substantially water-insoluble and have film-forming properties are preferable, with those having a good compatibility with diazo resin, oleophilic properties, and excellent abrasion resistance being particularly preferable. Specific examples thereof include polystyrene, polyvinyl chloride, polyacrylate or polymethacrylate, polyester, polyamide, polyurethane, polycarbonate, epoxy resin, polyvinyl formal, polyvinyl butyral, and alkylphenol-formaldehyde resin. Of these, polyacrylates or polymethacrylates with an acid value of 10 to 200 are preferable. As particularly preferable examples of the polyacrylates or polymethacrylates with an acid value of 10 to 200, there are illustrated copolymers containing acrylic acid, methacrylic acid, crotonic acid or maleic acid as a necessary ingredient such as multicomponents copolymers comprising 2-hydroxyethyl acrylate or 2-hydroxyethyl methacrylate, acrylonitrile or methacrylonitrile, acrylic or methacrylic acid and, if necessary, other copolymerizable monomer or monomers as described in Japanese Patent Application (OPI) No. 118802/75 (corresponding to U.S. Pat. No. 4,123,276), multicomponents copolymers comprising acrylic or methacrylic acid esterified with a group having a terminal hydroxy group and a dicarboxylic ester residue, acrylic or methacrylic acid and, if necessary, other copolymerizable monomer or monomers as described in Japanese Patent Application (OPI) No. 120903/78, multicomponents copolymers comprising a monomer having an aromatic hydroxy group at the terminus (for example, N-(4-hydroxyphenyl)methacrylamide), acrylic or methacrylic acid and, if necessary, other copolymerizable monomer or monomers as described in Japanese Patent Application (OPI) No. 98614/79, and multicomponents copolymers comprising alkyl acrylate or methacrylate, acrylonitrile or methacrylonitrile, and unsaturated carboxylic acid as described in Japanese Patent Application (OPI) No. 4144/81. In addition, acidic polyvinyl alcohol derivatives and acidic cellulose derivatives are also useful. Additionally, substantially water-insoluble organic high molecular binders to be used in the present invention mean those with a solubility in water of about 1 wt % or less at an ordinary temperature.

The contents of the diazo resin and the high molecular compound in the light-sensitive layer are: 3 to 30 wt % of the diazo resin and 97 to 70 wt % of the high molecular compound based on the total weight of the two, with 5 to 20 wt % of the diazo resin and 95 to 80 wt % of the high molecular compound being more preferable. The smaller the content of the diazo resin, the higher the sensitivity but, if the content is less than 3 wt %, photohardening of the high molecular compound becomes so insufficient that photohardened film will be swollen with a developer upon development to undergo weakening of the film. On the other hand, if the content of the diazo resin exceeds 30 wt %, there results such a reduced sensitivity that the product cannot be practically used.

The light-sensitive layer is coated in a dry coated amount of about 0.1 to 5 $g/m^2$.

In making a lithographic printing plate from the presensitized lithographic plate of the present invention, conventionally known procedures can be utilized as such. That is, the presensitized lithographic plate is exposed through a transparency having a line image and/or halftone dot image, then processed with a developer to remove non-image areas of the light-sensitive layer. As suitable light sources to be used for the exposure, a mercury lamp, xenon lamp, chemical lamp, metal halide lamp, strobo, etc., are used. As the developer, a proper one may be used according to the composition of the light-sensitive layer. For example, for a light-sensitive layer comprising a diazo compound and an organic high molecular binder, aqueous alkaline developers described in U.S. Pat. Nos. 3,475,171, 3,669,660, 4,186,006, etc., are used.

The present invention will now be described in more detail by reference to following non-limiting examples. Percentages in the examples are by weight unless otherwise specified.

EXAMPLE 1

A 0.24 mm thick aluminum plate was soaked in a 7% aqueous solution of sodium tertiary phosphate (solution temperature: 60° C.) for 3 minutes to degrease the plate and, after washing with water, the surface of the plate was rubbed with a nylon brush while applying thereto an aqueous suspension of pumice powder to conduct graining. After washing with water, the plate was soaked in a 5% aqueous solution (solution temperature: 70° C.) of sodium silicate ($SiO_2/Na_2O = 3.1$ to 3.3 (molar ratio)) for 30 to 60 seconds, then well washed with water and dried.

A 1% aqueous solution of the copolymer of the following formulation A was coated on the thus treated aluminum plate and dried to form a subbing layer. The dry amount of the coated subbing layer was 0.05 $g/m^2$.

Formulation A

Methyl methacrylate/ethyl acrylate/sodium 2-acrylamido-2-methylpropanesulfonate (50:30:20 molar ratio) copolymer (mean molecular weight: about 60,000).

A solution of the following formulation (a) was coated on the subbing layer to obtain a presensitized lithographic plate. This plate was referred to as Sample (1).

| Formulation (a) | |
|---|---|
| 2-Hydroxyethyl methacrylate copolymer (I) (described in Example 1 of U.S. Pat. No. 4,123,276) | 0.87 g |
| 2-Methoxy-4-hydroxy-5-benzoylbenzene-sulfonate of a condensate between p-diazodiphenylamine and paraformaldehyde | 0.1 g |
| "Oil Blue #603" (blue dye, C.I. 74350, made by Orient Kagaku Kogyo Kabushiki Kaisha) | 0.03 g |
| Methanol | 6 g |
| 2-Methoxyethanol | 6 g |

The dry coated amount of the light-sensitive layer was 2.0 $g/m^2$.

For the purpose of comparison, the same presensitized lithographic plate as Sample (1) except for not having the subbing layer was prepared. This was referred to as Sample (2).

Each of these samples was left for 5 days under the conditions of 40° C. and 80% RH, exposed, and subjected to the same plate-making procedures as described in Example 1 of U.S. Pat. No. 4,123,276 (incorporated herein by reference to disclose such procedures). When printing was conducted using each of the thus obtained Lithographic Printing Plates (1) and (2), reproductions printed by the Printing Plate (2) had background stains, whereas those by the Printing Plate (1) had no background stains. Additionally, almost no differences were observed between (1) and (2) in other printing properties such as printing durability.

EXAMPLES 2 TO 5

An aluminum plate was soaked in a 20% sodium phosphate aqueous solution to degrease and, after conducting electrolytic etching, anodized in a sulfuric acid solution, then subjected to pore-sealing treatment in a sodium metasilicate aqueous solution.

A light-sensitive solution of the following formulation (b) was coated on the thus treated aluminum plate and dried to form a light-sensitive layer having 2 g/m² of dry weight. Accordingly, a presensitized plate was obtained. This plate was referred to as Comparative Sample (3).

| Formulation (b) | |
| --- | --- |
| N—(4-Hydroxyphenyl)methacrylamide/ 2-hydroxyethyl methacrylate/acrylonitrile/methyl methacrylate/methacrylic acid ( = 15:10:30:38:7 molar ratio) copolymer (mean molecular weight: 60,000) | 5.0 g |
| Hexafluorophosphate of a condensate of 4-diazodiphenylamine with formaldehyde | 0.5 g |
| Phosphorous acid | 0.05 g |
| Victoria Pure Blue BOH (made by Hodogaya Chemical Co., Ltd.) | 0.1 g |
| 2-Methoxyethanol | 100 g |

On the same aluminum support as used in this Comparative Sample (3) was coated a 1% solution (solvent: water/methanol 50 wt % mixture) of each of the copolymers of the formulations B to E described below. The coating was dried to form a subbing layer, followed by coating the light-sensitive solution of formulation (b) in a dry weight of 2 g/m² to obtain presensitized lithographic plates. These plates were referred to as Samples (4) to (7).

TABLE 1

| | Formulations of the Copolymers | | | |
| --- | --- | --- | --- | --- |
| Ingredient | Formulation B (mol %) | Formulation C (mol %) | Formulation D (mol %) | Formulation E (mol %) |
| Methyl methacrylate | 30 | — | — | 40 |
| N—t-butylacrylamide | — | 40 | 50 | — |
| Methyl acrylate | 40 | 40 | 30 | 40 |
| Sodium p-styrene-sulfonate | 30 | 10 | — | — |
| Sodium 2-acrylamido-2-methylpropane sulfonate | — | 10 | 15 | 10 |
| Sodium vinylsulfonate | — | — | 5 | — |
| Methacrylic acid | — | — | — | 10 |

TABLE 1-continued

| | Formulations of the Copolymers | | | |
| --- | --- | --- | --- | --- |
| Ingredient | Formulation B (mol %) | Formulation C (mol %) | Formulation D (mol %) | Formulation E (mol %) |
| Mean M.W. | 80,000 | 40,000 | 20,000 | 60,000 |

In every sample, the dry coated weight of the subbing layer was 0.005 g/m². Each of these Samples (4) to (7) and Comparative Sample (3) was left for 5 days at 40° C. and 80% RH, exposed, and subjected to plate-making procedures in the same manner as in Example 1. When printing was conducted using the thus obtained Lithographic Printing Plates (3) to (7), Samples (4) to (7) remarkably depressed formation of background stains in comparison with Comparative Sample (3) having no subbing layer, thus fully exerting the effects of the present invention.

EXAMPLE 6

A 0.30 mm thick aluminum plate was surface-grained using a nylon brush and an aqueous suspension of 400 mesh pumice and thoroughly washed with water. Then, the aluminum plate was soaked in 10% sodium hydroxide at 70° C. for 60 seconds in order to etch the plate. The etched plate was then washed with running water, neutralized with 20% $HNO_3$, and thoroughly washed with water. The plate was then subjected to electrolytical graining treatment in a 1% nitric acid aqueous solution using sine wave alternating current under the conditions of $V_A = 12.7$ V and an anodic electric amount of 160 coulomb/dm² to attain a surface roughness of 0.6μ (Ra). Subsequently, the plate was soaked in a 30% $H_2SO_4$ aqueous solution to desmut at 55° C. for 2 minutes, anodized in a 20% $H_2SO_4$ aqueous solution for 2 minutes at a current density of 2 A/dm² to attain a thickness of 2.7 g/m², and then soaked in a 2.5% sodium silicate aqueous solution at 70° C. for 1 minute, washed with water, and dried.

This aluminum plate was coated with a copolymer of the same formulation A as used in Example 1 in the same manner as in Example 1 in a dry coated amount of 0.005 g/m² to form a subbing layer.

Light-sensitive solution (1) was then prepared.

| Light-Sensitive Solution (1) | |
| --- | --- |
| Pentaerythritol tetraacrylate | 200 g |
| Poly(allyl methacrylate/methacrylic acid) copolymer (molar ratio: 85/15) | 300 g |
| 2-Trichloromethyl-5-(p-n-butoxy-styryl)-1,3,4-oxadiazole | 24 g |
| 2-Methoxy-4-hydroxy-5-benzoylbenzene-sulfonate of a condensate between 4-diazodiphenylamine and formaldehyde | 70 g |
| Crystal Violet p-toluenesulfonate | 10 g |
| Ethylene glycol monomethyl ether | 2,000 g |
| Methyl alcohol | 700 g |
| Methyl ethyl ketone | 1,300 g |

Additionally, the poly(allyl methacrylate/methacrylic acid) was synthesized as follows. 1.68 l of a reaction solvent of 1,2-dichloroethane was added to a 3-liter four neck flask equipped with a stirring rod, stirring blade, reflux condenser, dropping funnel, and thermometer and heated to 70° C. while replacing the atmosphere with nitrogen. A solution of 100.8 g of allyl methacrylate, 7.6 g of methacrylic acid, and 1.68 g of a polymerization initiator of 2,2'-azobis(2,4-dimethylvaleronitrile)

in 0.44 liter of 1,2-dichloroethane was placed in the dropping funnel, and the mixture solution was dropwise added to the flask over a period of 2 hours under stirring.

After completion of the dropwise addition, the stirring was continued for 5 hours at a reaction temperature of 70° C. to complete the reaction. After heating, 0.04 g of p-methoxyphenol was added to the reaction solution, and the solution was concentrated to 500 ml. The concentrate was added to 4 liters of hexane to precipitate. Vacuum drying of the precipitate gave 61 g (yield: 56%) of a copolymer. Viscosity: $[\eta]=0.068$ at 30° C. in MEK solution.

After being filtered, the light-sensitive solution (1) was coated on the foregoing subbed base plate in a dry coated amount of 2.5 g/m². Drying was conducted at 100° C. for 2 minutes.

Then, a 3% aqueous solution of polyvinyl alcohol (viscosity: 5.3±0.5 cps in 4% aqueous solution at 20° C. (measured according to H/ pler method); saponification degree: 86.5 to 89.0 mol %; polymerization degree: not more than 1,000) was coated on the surface of the above-described light-sensitive layer in a dry amount of 1.0 g/m². The thus obtained presensitized lithographic plate was referred to as Sample (8).

For the purpose of comparison, a presensitized lithographic plate was prepared in the same manner as with Sample (8) except for not providing the subbing layer. This was referred to as Sample (9).

These Samples (8) and (9) were stored for 10 days in an atmosphere of 40° C. and 80% RH, exposed, and developed with the developer of the following formulation to obtain Lithographic Printing Plates (8) and (9). Comparison of the printing plates with each other revealed that Lithographic Printing Plate (8) suffered much less background stains than Lithographic Printing Plate (9).

| Developer | |
|---|---|
| Sodium sulfite | 5 g |
| Benzyl alcohol | 30 g |
| Sodium carbonate | 5 g |
| Sodium isopropylnapthalenesulfonate | 12 g |
| Pure water | 1,000 g |

While the invention has been described in detail and with reference to specific embodiments thereof, it will be apparent to one skilled in the art that various changes and modifications can be made therein without departing from the spirit and scope thereof.

What is claimed is:

1. A presensitized lithographic plate, comprising:
an anodized aluminum support treated with a sodium silicate aqueous solution;
a subbing layer provided on said support, wherein said subbing layer comprises a high molecular weight compound containing sulfonic acid group-containing monomer units as recurring units and has a molecular weight in the range of 1000 to about 1,000,000; and
a light-sensitive layer provided on said subbing layer, wherein said light-sensitive layer comprises, in admixture, a diazo resin condensate of an aromatic diazo compound and an active carbonyl or active ether compound, and an organic high molecular weight binder; wherein the amounts of said condensate and said binder are in the range of 3 to 30 wt % and 97 to 70 wt %, respectively, based on the total weight of the condensate and the binder.

2. A presensitized lithographic plate as claimed in claim 1, wherein said monomer units are that which are derived from a monomers selected from the group consisting of p-styrenesulfonic acid, 2-acrylamido-2-methylpropanesulfonic acid, ethylenesulfonic acid, and alkali metal salts, ammonium salts, and water-soluble amine salts thereof.

3. A presensitized lithographic plate as claimed in claim 2, wherein said light-sensitive layer contains a substantially water-insoluble and organic solvent-soluble diazo resin and an organic high molecular weight binder.

4. A presensitized lithographic plate as claimed in claim 3, wherein the diazo resin is a halogenated Lewis acid salt of a condensate between an aromatic diazonium compound and an active carbonyl compound or an active ether compound.

5. A presensitized lithographic plate as claimed in claim 3, wherein the high molecular weight compound has a molecular weight in the range of 2,000 to 100,000.

6. A presensitized lithographic plate as claimed in claim 5, wherein the high molecular weight compound has a molecular weight in the range of 10,000 to 100,000.

7. A presensitized lithographic plate as claimed in claim 3, wherein the sulfonic acid group-containing monomer units are present in the high molecular weight compound in an amount in the range of 1 to 100 mol %.

8. A presensitized lithographic plate as claimed in claim 7, wherein the sulfonic acid group-containing monomer units are present in the high molecular weight compound in an amount in the range of 5 to 100 mol %.

9. A presensitized lithographic plate as claimed in claim 3, wherein the high molecular weight compound of the subbing layer is present on the support base in an amount in the range of 0.0001 to 1 g/m².

10. A presensitized lithographic plate as claimed in claim 9, wherein the high molecular compound of the subbing layer is present on the support base in an amount in the range of 0.0005 to 0.2 g/m².

11. A presensitized lithographic plate as claimed in claim 4, wherein the high molecular weight compound has a molecular weight in the range of 2,000 to 100,000.

12. A presensitized lithographic plate as claimed in claim 11, wherein the high molecular weight compound has a molecular weight in the range of 10,000 to 100,000.

13. A presensitized lithographic plate as claimed in claim 4, wherein the sulfonic acid group-containing monomer units are present in the high molecular weight compound in an amount in the range of 1 to 100 mol %.

14. A presensitized lithographic plate as claimed in claim 13, wherein the sulfonic acid group-containing monomer units are present in the high molecular weight compound in an amount in the range of 5 to 100 mol %.

15. A presensitized lithographic plate as claimed in claim 4, wherein the high molecular weight compound of the subbing layer is present on the support base in an amount in the range of 0.001 to 1 g/m².

16. A presensitized lithographic plate as claimed in claim 15, wherein the high molecular weight compound of the subbing layer is present on the support base in an amount in the range of 0.005 to 0.2 g/m².

17. A presensitized lithographic plate as claimed in claim 1, wherein the high molecular weight compound has a molecular weight in the range of 2,000 to 100,000.

18. A presensitized lithographic plate as claimed in claim 17, wherein the high molecular weight compound has a molecular weight in the range of 10,000 to 100,000.

19. A presensitized lithographic plate as claimed in claim 1, wherein the sulfonic acid group-containing monomer units are present in the high molecular weight compound in an amount in the range of 1 to 100 mol %.

20. A presensitized lithographic plate as claimed in claim 19, wherein the sulfonic acid group-containing monomer units are present in the high molecular weight compound in an amount in the range of 5 to 100 mol %.

21. A presensitized lithographic plate as claimed in claim 1, wherein the high molecular weight compound of the subbing layer is present on the support base in an amount in the range of 0.0001 to 1 g/m$^2$.

22. A presensitized lithographic plate as claimed in claim 21, wherein the high molecular weight compound of the subbing layer is present on the support base in an amount in the range of 0.0005 to 0.2 g/m$^2$.

23. A presensitized lithographic plate as claimed in claim 1, wherein said light-sensitive layer further comprises a photopolymerizable composition.

* * * * *